United States Patent
Sim et al.

(10) Patent No.: US 7,615,821 B2
(45) Date of Patent: Nov. 10, 2009

(54) CHARGE TRAP MEMORY WITH AVALANCHE GENERATION INDUCING LAYER

(75) Inventors: Jae Sung Sim, Seoul (KR); Byung Gook Park, Seoul (KR); Jong Duk Lee, Seoul (KR); Chung Woo Kim, Gyeonggi-do (KR)

(73) Assignees: Seoul National University Industry Foundation, Seoul (KR); Samsung Electronics Co., Ltd., Gyeonggi-do (KR)

( * ) Notice: Subject to any disclaimer, the term of this patent is extended or adjusted under 35 U.S.C. 154(b) by 357 days.

(21) Appl. No.: 11/346,659

(22) Filed: Feb. 3, 2006

(65) Prior Publication Data

US 2006/0171209 A1    Aug. 3, 2006

(30) Foreign Application Priority Data

| Feb. 3, 2005 | (KR) | ........................ 10-2005-0009844 |
| Feb. 3, 2005 | (KR) | ........................ 10-2005-0009845 |
| Feb. 3, 2005 | (KR) | ........................ 10-2005-0009846 |

(51) Int. Cl.
*H01L 29/792* (2006.01)

(52) U.S. Cl. ............................. 257/324; 257/E29.309

(58) Field of Classification Search ................ 257/324, 257/325, 326, E29.309, E21.423
See application file for complete search history.

(56) References Cited

U.S. PATENT DOCUMENTS

| 6,009,017 | A | 12/1999 | Guo et al. |
| 6,657,892 | B2 | 12/2003 | Sakui et al. |
| 6,788,573 | B2 | 9/2004 | Choi |
| 6,791,883 | B2 | 9/2004 | Swift et al. |
| 6,836,435 | B2 | 12/2004 | Li |
| 6,911,691 | B2 | 6/2005 | Tomiie et al. |
| 7,180,125 | B2 * | 2/2007 | Wang .......................... 257/315 |
| 2003/0025147 | A1 * | 2/2003 | Nomoto et al. ............. 257/314 |

OTHER PUBLICATIONS

Sim et al., BAVI-Cell: A Novel High-Speed 50 nm SONOS Memory with Band-to-Band Tunneling Initiated Avalanche Injection Mechanism, 2005 Symposium on VLSI Technology Digest of Technical Papers, pp. 122-123.*
IEEE Elec. Dev. Lett., vol. 21, pp. 543-545, 2000.
Trans. Electron. Dev., vol. 49, No. 11, pp. 1939-1946, 2002.
Dig. Symp. VLSI Tech., 1997, pp. 113-114.
Ext. Abst. Int'l Conf. Solid State Dev. Materials, 2002, pp. 162, 163.
Tech. Dig. Int'l Electron Dev. Meet., 2003, pp. 613-616.

* cited by examiner

*Primary Examiner*—Anh Phung
*Assistant Examiner*—Michael Lulis
(74) *Attorney, Agent, or Firm*—Marger Johnson & McCollom PC

(57) ABSTRACT

The present invention discloses a charge trap flash memory cell with multi-doped layers at the active region, a memory array using of the memory cell, and an operating method of the same. The charge trap memory cell structure of the present invention is characterized by forming multi-doped layers at the active region appropriately, and it is a difference from the conventional art. The present invention induces electrons to band-to-band tunnel at the PN junction with the source/drain region by the multi-doped layers, and accelerates the electrons at the reverse bias to generate an avalanche phenomenon. Therefore, the method for operating a memory array of the present invention comprises programming by injecting holes which are generated by the avalanche phenomenon into multi-dielectric layers of each memory cells, and erasing by injecting electrons through an F-N tunneling from channels into the multi-dielectric layers of each memory cells.

14 Claims, 10 Drawing Sheets

CHARGE TRAP MEMORY WITH AVALANCHE GENERATION INDUCING LAYER

BACKGROUND OF THE INVENTION

1. Field of the Invention

The present invention relates to a flash memory cell structure, and more particularly to a charge trap memory cell structure with multi-doped layers at the active region, to a fabricating method and an operating method thereof, and to a flash memory array using the charge trap memory cell and an operating method of the same.

2. Description of Related Art

Flash memory is a class of non-volatile semiconductor memories which can erase data by a block unit over several tens and hundreds of bytes, and record data by a byte or page unit, and it is distinguished from EEPROM which can erase and record data by a cell unit.

The importance of a non-volatile semiconductor memory has been increasing due to a gaining popularity of modern mobile and multimedia computing environments such as mobile phones, PDAs, MP3 players, USB drives, and so on, and to an increasing necessity for a portable recording device suitable for large amount of information. Therefore, a reduction in cell size and electric power consumption and a high speed operation have been needed to meet an increase in consumption for a flash memory.

A conventional flash memory is classified as NOR and NAND type, according to its array organization of unit cells. In a NOR type flash memory, cells are connected in parallel, and in a NAND type, cells are connected in series between a bit line and a source line. NOR type is mainly used for code storage, where the program or the operating system is stored and executed by the microprocessor or microcontroller. NAND type is for data storage, where data files for image, music, and voice are recorded and read sequentially.

To attain a large capacity, low power-consumption, and rapid flash memory, there has been necessarily a need for developing the essential memory cell.

However, as the device dimensions enter into the ultimate scaling limit of the nanometer regime, cell reduction is facing challenging issues in the FLOTOX (Floating-Gate-Tunneling-Oxide) cell, as shown in FIG. 1. This is because a decrease in a gap between cells causes coupling of floating gates and increases a mutual interferences between cells. Referring to FIG. 1, reference number 41 indicates an oxide layer, 43 means a nitride layer, 47 means a tunnel oxide layer, 50 means a gate, 52 is a floating gate, 30 is a source or drain, and 10 indicates a semiconductor substrate.

Accordingly, in recent times the charge trap flash memory device, wherein the structure has a simple process for fabricating and little dependence on a coupling, and in the MOSFET structure as shown in FIG. 2, multi-dielectric layers (40) have been inserted in place of a gate oxide layer, and they function as a charge trap layer, has gained its popularity as the flash memory cell of the next generation. There are typical examples of the charge trap flash memory cell such as SONOS (Silicon-Oxide-Nitride-Oxide-Silicon), MONOS (Metal-Oxide-Nitride-Oxide-Silicon), and MNOS (Metal-Nitride-Oxide-Silicon), and these all utilize lots of deep level traps which exist inside the nitride layer (44) of the multi-dielectric layers (40). Referring to FIG. 2, reference number 42 indicates a blocking oxide layer, 46 means a tunnel oxide layer.

However, the conventional charge trap memory cells have been generally manufactured in the NMOS type as well as the floating gate memory cells (FLOTOX cells). For that reason, Channel-Hot-Electron (CHE) injection or Fowler-Nordheim (F-N) tunneling injection has been used to inject electrons into the nitride layer of the multi-dielectric layers for programming.

With the CHE injection scheme, injected electrons hardly move laterally within the nitride layer due to the separated nitride traps, but they are distributed almost around the upper part of the drain or source, where electrons were injected, and such a feature makes it possible to store two bits in a single cell. The CHE injection scheme has been used successfully in Virtual Ground Array, named of NROM™ or MirrorBit™, which is classified as a NOR flash memory.

But there were some problems in the CHE injection scheme. Because the CHE injection scheme needs a large lateral electric field on a channel for programming, it should be able to apply different voltages freely to both the source and drain respectively (IEEE Elec. Dev. Lett., vol. 21, pp. 543-545, 2000). And there are limitations on downscaling the channel, due to interference between trapped electrons, a transfer of electrons to neighboring trap regions, and so on. Also, there is another drawback in that inefficiency of injection makes the electric power consumption high (Trans. Electron Dev., vol. 49, no. 11, pp. 1939-1946, 2002).

The conventional charge trap memory cell has advantages in that there is no need for a floating gate and the simple structure, which can be accomplished only by the multi-dielectric layers, makes the manufacturing process easier. But it has a decisive drawback in that it is very difficult for the charge trap memory cell to remove electrons injected by programming.

The deep level traps in the nitride layer prevent once-injected electrons from leaving, and it improves electron retention. But it causes a huge rise in operating voltage for erasing.

It is generally explained that when a high negative bias is applied to a gate, electrons cannot be easily ejected from a deep trap in the nitride layer, therefore holes are injected through F-N tunneling from the channel and combined again with already-programmed electrons, and finally the erase operation is accomplished.

However, hole tunneling current is much smaller than electron tunneling current for the same conditions. Comparing with the FLOTOX cell, which uses a floating gate, a conductor, the charge trap memory cell, which uses a dielectric material for electric charge storage, has a very small coupling ratio, and there is a basic limit to concentrate the applied gate voltage on the tunneling oxide layer. Therefore these two factors of low hole tunneling current and a small coupling ratio at severe negative gate voltage cause the back tunnel effect in that electron tunneling starts from the gate, as shown in FIG. 3, and this effect slows down erase speed and stops recovery to the original state of threshold voltage at certain level.

After all, to commercialize the charge trap memory, this drawback of the incomplete erase problem should be overcome.

At present, NROM™ charge trap memory, which stores two bits per cell, uses the hot hole injection scheme to solve the erase problem. In this scheme, as shown in FIG. 4, when a high negative voltage that is reverse biased is applied between the source or drain and body in the NMOS structure, the $N^+$ region of the source or drain under the gate becomes inverted on the surface, and a hole is induced.

Then, a large electric field is built up at the partially induced $N^+$-$P^+$ junction region, resulting in a Band-to-Band Tunneling phenomenon. After that, holes escaping toward the channel are accelerated due to the applied voltage between source or drain and body, and among these, hot holes, which have enough momentum, can be easily injected into the nitride layer with the help of the gate voltage. Such hot holes have much larger energy in comparison with F-N tunneling holes, and they can be effectively injected into the nitride layer in spite of the heavy mass of a hole and a high tunneling barrier.

However, to generate the erase operation by this hot hole injection scheme, there is need to bias a certain voltage to the source and drain as well as to the gate and body, but it is impossible to apply to the NAND type array. With the conventional NMOS type memory cell, applying a negative high voltage to the gate to erase by the hot hole injection scheme causes the channel to turn off due to an accumulation mode, and the voltage provided by the bit line of a conventional NAND array cannot be delivered effectively to the source and drain of each cell, which is connected in series.

Therefore, the delay of charge trap memory commercialization is caused mainly by the erase speed problem of NAND type flash memory by the back tunnel effect because only the F-N tunneling scheme must be used for both program and erase in NAND type flash memory at this time.

On the other hand, there have been various trials to improve the erase speed not by the hot hole injection scheme but by the F-N tunneling scheme.

Among them, Reisinger et al., used a polysilicon doped with $P^+$ rather than $N^+$ on the gate of the charge trap memory cell, and this raised the tunneling barrier between the gate and the nitride layer to lessen the back tunnel effect (Dig. Symp. VLSI Tech., 1997, pp. 113-114). But when a severe negative voltage is applied to the gate word line, valence band electrons at the gate tunnel to the nitride layer and there are still some limits for improving the erase speed.

Other ways to improve the erase speed is to replace the blocking oxide in FIG. 2 with high-k dielectrics (for instance, $Al_2O_3$) to increase the capacitance of the blocking layer and concentrate the electric field on the tunnel oxide layer (Ext. Abst. Int'l Conf. Solid State Dev. Materials, 2002, pp. 162-163), or to use metal TaN (TANOS structure), instead of polysilicon for the gate of a charge trap memory cell, heighten the tunneling barrier of a gate, and restrain back tunneling (Tech. Dig. Int'l Electron Dev. Meet., 2003, pp. 613-616). But these ways still have problems in that the use of a high-k material or a metal gate severely diminishes the silicon CMOS technology compatibility, and the difficulty in applying a tunnel oxide layer with more than a specific thickness in the TANOS structure makes the disadvantage of charge retention characteristics insurmountable.

SUMMARY OF THE INVENTION

Accordingly, the present invention is directed to a new PMOS type charge trap memory cell structure, a method of fabricating the same and a mechanism of operating the same that substantially obviates one or more of the problems due to limitations and disadvantages of the related art.

Another aspect of the present invention is to provide a NAND type flash memory array that uses the charge trap memory cell, and a method of operating the same.

A further aspect of the present invention is to provide a NOR type flash memory array that uses the charge trap memory cell, and a method of operating the same.

To achieve these aspects, and in accordance with the purpose of the present invention, a charge trap memory cell structure according to embodiments of the present invention can be characterized by the active region with multi-doped layers in the conventional charge trap memory cell structure, which comprises a semiconductor substrate having active and field regions; a gate formed over the active region; source and drain regions formed in the active region, wherein source and drain regions are adjacent to the gate, and a gap is located between source and drain regions; and multi-dielectric layers including a charge trap layer, wherein multi-dielectric layers are located between the gate and the active region of substrate.

A method of fabricating a charge trap memory cell according to embodiments of the present invention comprises: forming an N-type well on a semiconductor substrate; forming multi-doped layers inside the N-type well; forming a multi-dielectric layers having a charge trap layer on the semiconductor substrate; forming a gate on the multi-dielectric layers; forming P-type source/drains in the semiconductor substrate next to both ends of the gate.

According to embodiments of the present invention, the charge trap memory cell may comprise source/drain regions doped with P-type impurities; an active region comprising a tunneling generation inducing layer formed with N-type impurities inside the N-type well of a semiconductor substrate to form a PN-junction with the source/drain regions; a gate formed over the active region; and multi-dielectric layers including a charge trap layer between the gate and the active region of substrate, the method for operating a charge trap memory cell comprises programming by applying a predetermined bias voltage to the source region, the drain region, the gate and the active region of substrate respectively, for accelerating electrons band-to-band tunneled from the tunneling generation inducing layer at the deep depletion region of the N-well to generate an avalanche phenomenon; accelerating holes generated from the avalanche phenomenon, from the deep depletion region of the N-well toward the surface of substrate again to generate hot holes; and injecting hot holes into the multi-dielectric layers with the help of the gate field.

A NAND type flash memory array, according to embodiments of the present invention, may have one or more bit lines, and on the each bit line, the first selective transistor, a plurality of charge trap memory cells and the second selective transistor are connected in series in a manner that each drain is connected to the corresponding source; a source of the second selective transistor is connected electrically to common source line which is arranged vertically to the bit line; a gate of the first selective transistor and a gate of the second selective transistor are connected electrically to the first selective gate line and the second selective gate line respectively which cross the bit lines; and gates of the plurality of charge trap memory cells are connected electrically to a plurality of word lines respectively which cross the bit lines, wherein the charge trap memory cell comprises: a semiconductor substrate; an active region which is formed with multi-doped layers in the substrate; a gate formed over the active region; source and drain regions formed in the active region, wherein source and drain regions are adjacent to the gate, and a gap is located between the source and drain regions; and multi-dielectric layers including a charge trap layer, wherein multi-dielectric layers are located between the gate and the active region of the substrate.

A method of operating a NAND type flash memory array according to embodiments of the present invention, as shown in FIG. 17, comprises programming and erasing the NAND type flash memory array, wherein the programming can be selecting only a specific cell (cell B) among the plurality of charge trap memory cells by applying a predetermined bias voltage on each active region (not shown in FIG.) of the each bit line (BL1, BL2), a plurality of word lines (WL1, WL2), a common source line (SL), the first selective gate line (SG1), the second selective gate line (SG2), and a plurality of charge trap memory cells (cell A, cell B, cell C and so on), for accelerating electrons band-to-band tunneled from the tunneling generation inducing layer of the selected specific charge trap memory cell (cell B) at the deep depletion of the N-well to generate an avalanche phenomenon; accelerating holes, which were generated from the avalanche phenomenon, from the deep depletion region of the N-well toward the surface of substrate again to generate hot holes; and injecting hot holes into the multi-dielectric layers of the specific charge trap memory cell (cell B) with the help of the gate field.

A NOR type flash memory array according to embodiments of the present invention, may have one or more bit lines, and on each bit line, drains of a plurality of charge trap memory cells are connected electrically to the bit line; gates of a plurality of charge trap memory cells are connected electrically to a plurality of word lines, respectively, which cross the bit lines; and sources of the plurality of charge trap memory cells are connected electrically to a plurality of source lines, respectively, which cross the bit lines, wherein the charge trap memory cell comprises: a semiconductor substrate; an active region, which is formed with multi-doped layers in the substrate; a gate formed over the active region; source and drain regions formed in the active region, wherein source and drain regions are adjacent to the gate, and a gap is located between source and drain regions; and multi-dielectric layers including a charge trap layer, wherein multi-dielectric layers are located between the gate and the active region.

A method of operating a NOR type flash memory array according to embodiments of the present invention, as shown in FIG. 18, comprises programming and erasing the NOR type flash memory array, wherein the programming may be selecting only a specific cell (cell 2) among a plurality of charge trap memory cells by applying a predetermined bias voltage on each active region (not shown in FIG.) of the each bit line (BL1, BL2), a plurality of word lines (WL1, WL2), a plurality of source lines (SL1, SL2), and a plurality of charge trap memory cells (cell 1, cell 2, cell 3 and so on), accelerating electrons band-to-band tunneled from the tunneling generation inducing layer of the selected specific charge trap memory cell (cell 2) at the deep depletion of the N-well to generate an avalanche phenomenon; accelerating holes, which were generated from the avalanche phenomenon, from the deep depletion region of the N-well toward the surface of substrate again to generate hot holes; and injecting hot holes into the multi-dielectric layers of the specific charge trap memory cell (cell 2) with the help of the gate field.

BRIEF DESCRIPTION OF THE FIGURES

The invention may be better understood by the drawings that are briefly described below and attached hereto, in the several figures of which identical reference numbers (if any) refer to identical or similar elements and wherein.

DETAILED DESCRIPTION

A detailed description of preferred embodiments of the present invention is provided with respect to the accompanying drawings. It must be comprehended that the following preferred embodiments are exemplary only to help understand the present invention and not to limit its interpretation.

First of all, detailed explanations of preferred embodiments of the charge trap memory cell structure of the present invention are as follows.

First Embodiment of the Memory Cell Structure

Figure 1:
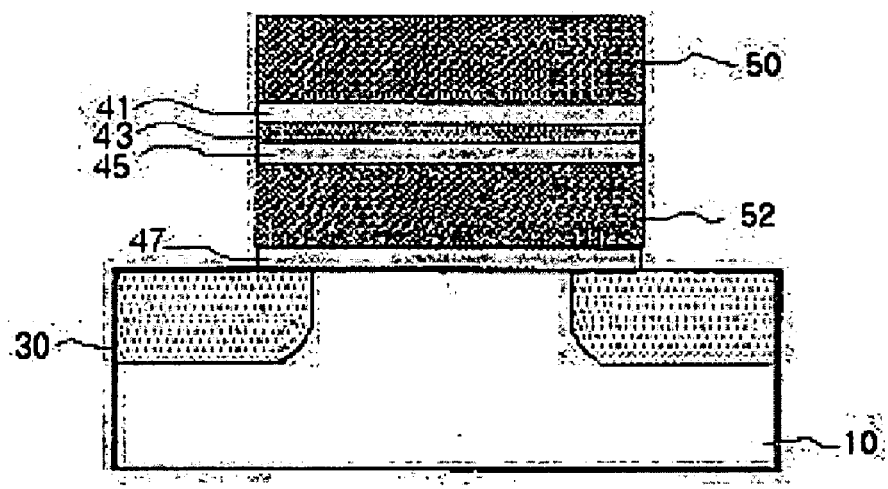
FIG. 1 is a cross-section of a conventional floating gate type flash memory cell (FLOTOX: Floating-Gate-Tunneling-Oxide).
Figure 2:
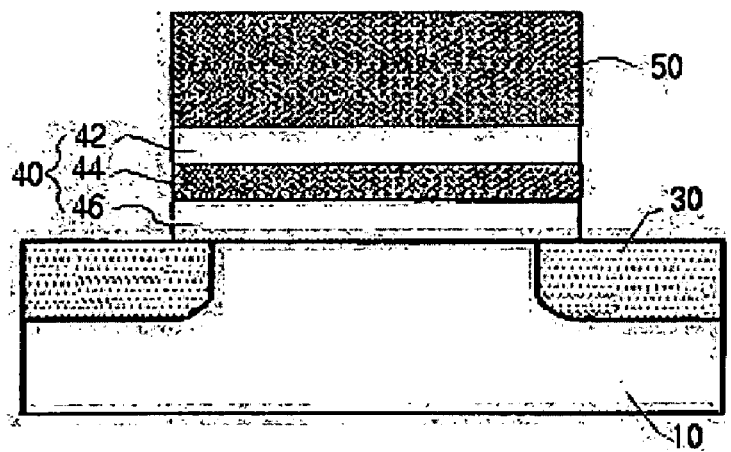
FIG. 2 is a cross-section of a conventional charge trap flash memory cell.
Figure 3:
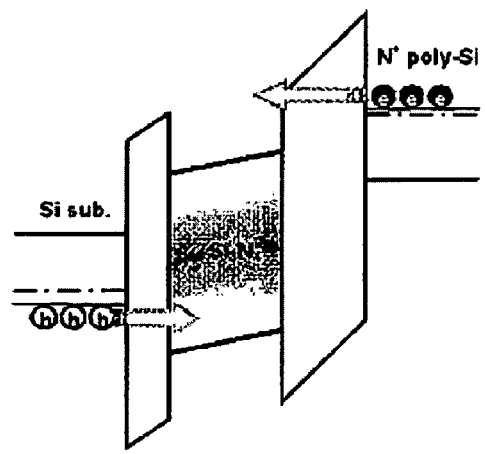
FIG. 3 is an energy band diagram illustrating the back tunnel effect when electrons start tunneling from a gate to a nitride layer in a conventional charge trap memory cell during a erase.
Figure 4:
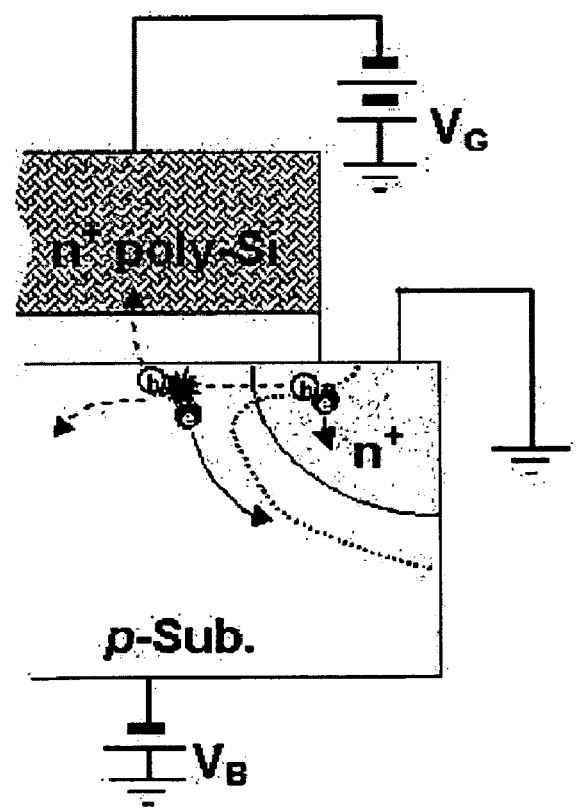
FIG. 4 illustrates a mechanism in which hot holes are induced by a gate and injected in a conventional charge trap memory cell.
Figure 5:
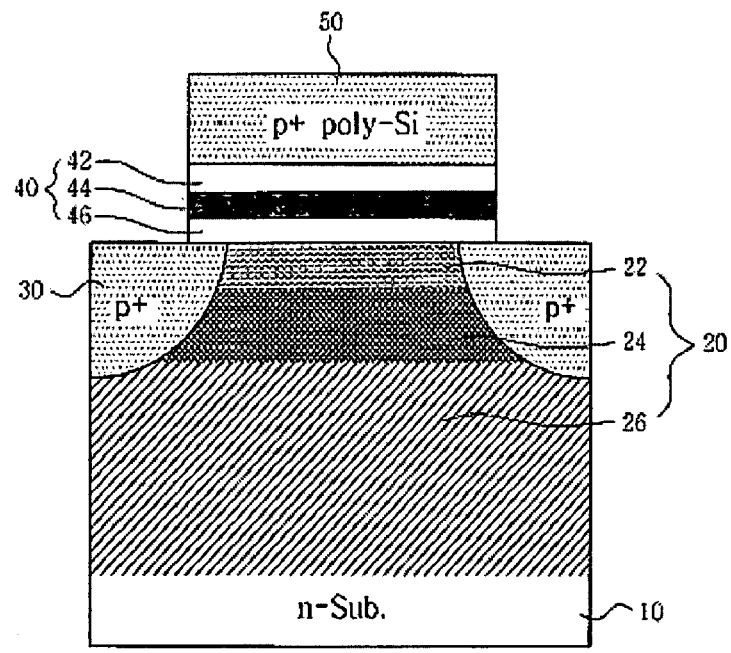
FIG. 5 is a cross-section of a charge trap memory cell structure with three doped layers according to one embodiment of the present invention.

The charge trap memory cell structure of the present invention is as shown in FIG. 5. That is, in conventional charge trap memory cell structure, a semiconductor substrate (10) is an N-type substrate, and the active region is formed by making three doped layers (20) in the substrate (10), and source/drain regions (30) are a PMOS structure doped with P-type impurities. The characteristic of this embodiment is an active region in the semiconductor substrate (10), wherein the active region is formed with multi-doped layers such as three doped layers (20).

Three doped layers (20) are composed of a threshold voltage control layer (22), a tunneling generation inducing layer (24), and an avalanche generation inducing layer (26) from top of the substrate.

A threshold voltage control layer (22) is formed by doping with P-type impurities thinly, not required essentially to embody the present invention, but required complementarily to maintain an appropriate initial threshold voltage and to prevent some problems for programming, erasing, and reading the cell. Without a threshold voltage control layer, high concentration of N-type impurities can be injected into the part as might be expected to form a channel by forming a tunneling generation inducing layer (24) and an avalanche generation inducing layer (26), and it results in heightening a threshold voltage of the cell.

Figure 6:
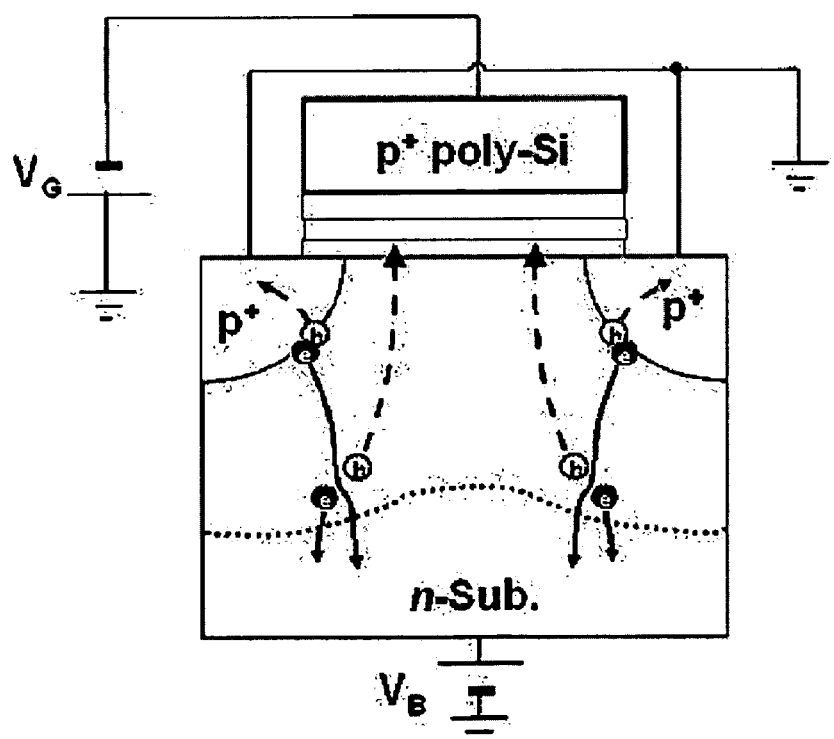
FIG. 6 illustrates that applying a reverse bias results in a deep depletion, and under this condition, the avalanche phenomenon is invoked by tunneled electrons, and holes formed there are injected to the nitride layer in the charge trap memory cell of the present invention.
Figure 7:
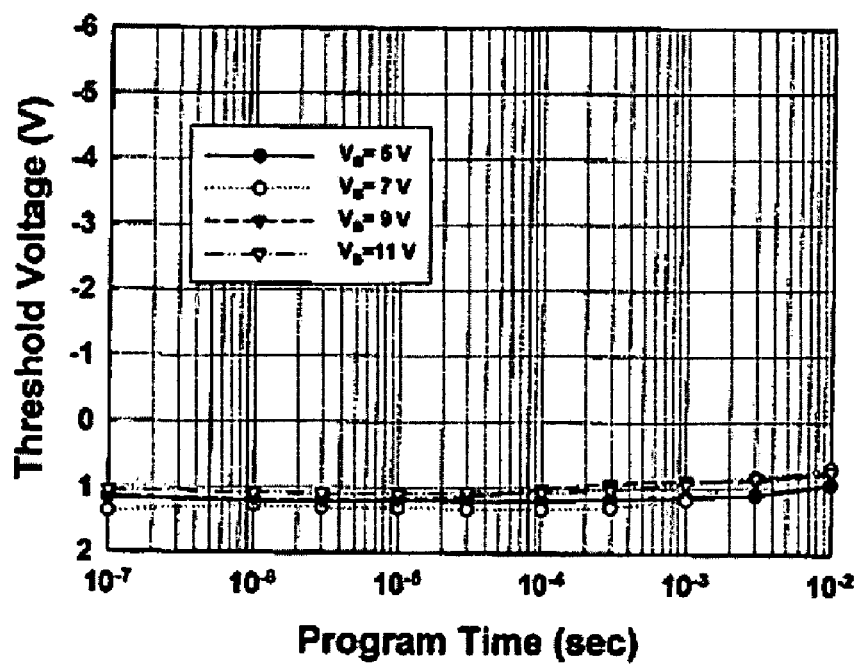
FIG. 7 is a graph illustrating the electrical characteristics of a program when a concentration of N-type impurities below a level in the avalanche generation inductive layer can't execute the avalanche phenomenon, in an embodiment of the present invention.
Figure 8:
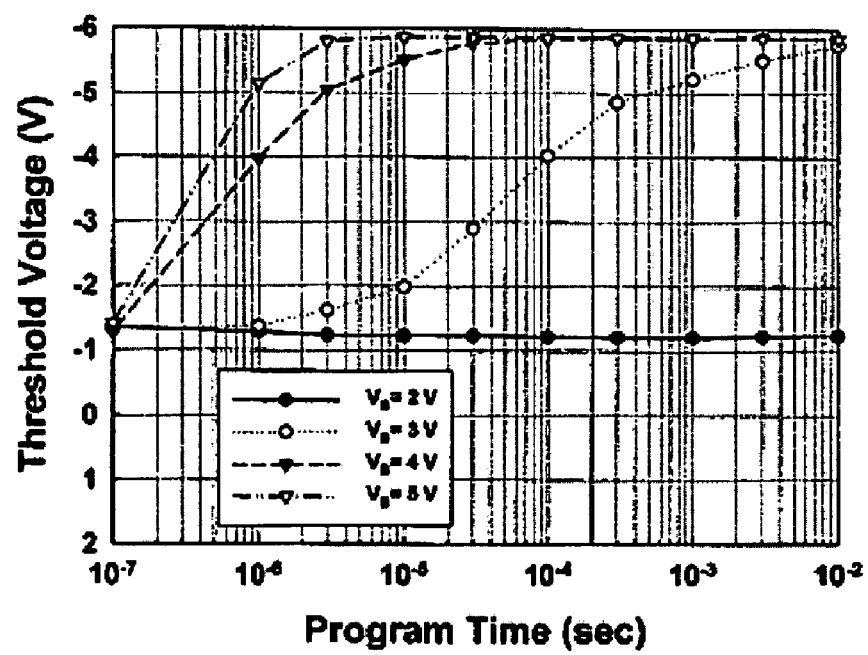
FIG. 8 is a graph illustrating the electrical characteristics of a program when a concentration of N-type impurities beyond a level in the avalanche generation inductive layer executes the avalanche phenomenon in an embodiment of the present invention.
Figure 10:
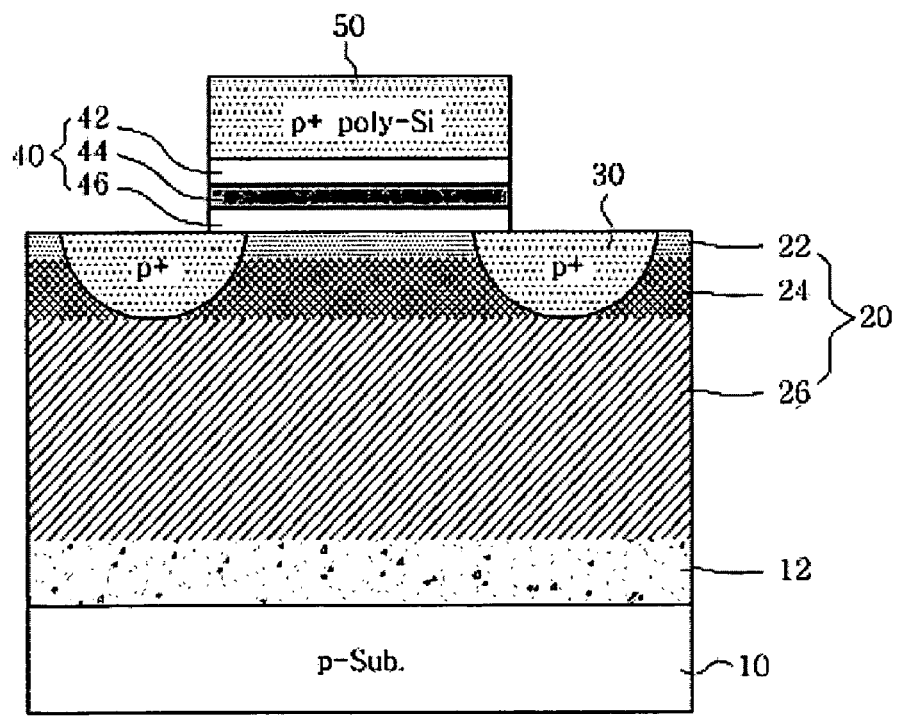
FIG. 10 is a cross-section of the charge trap memory cell structure with three doped layers inside the N-type well according to another embodiment of the present invention.
Figure 11:
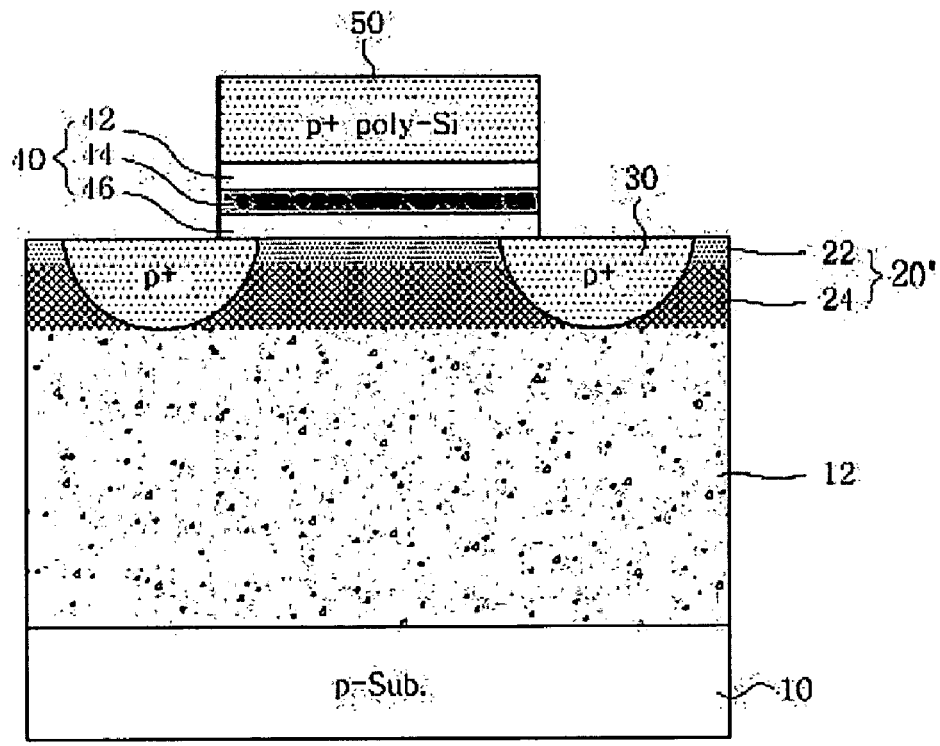
FIG. 11 is a cross-section of the charge trap memory cell structure with two doped layers inside the N-type well according to another embodiment of the present invention.

An avalanche inducing layer (26) is formed by doping with N-type impurities widely and deeply below a source/drain region (30). As shown in FIG. 6, when a reverse bias is applied, it makes a deep depletion, accelerates electrons, which have been band-to-band tunneled around the PN junction region, where the source/drain region (30) and a tunneling generation inducing layer (24) are together to generate an avalanche phenomenon, and accelerates holes, which have been formed from the avalanche phenomenon, toward the opposite direction. So, an avalanche generation inducing layer is a necessary doped layer to embody the present invention. As shown in FIG. 5 and FIG. 10, an avalanche generation inducing layer can be formed separately, and also an N-type well can be replaced with an avalanche generation inducing layer as shown in FIG. 11. To generate an avalanche phenomenon and accelerate holes appropriately, the peak doping concentration of N-type impurities needs to be controlled, and preferably, the concentration is above $5 \times 10^{17}/cm^3$. When the concentration of N-type impurities of an avalanche generation inducing layer (26) is below (as shown in FIG. 7) or above the specific level (as shown in FIG. 8), it affects cell operation decisively.

A tunneling generation inducing layer (24), a doped layer formed between the threshold voltage control layer (22) and the avalanche generation inducing layer (26), is doped to create a PN junction with the source/drain region (30) by the same or heavier N-type impurities than of the avalanche generation inducing layer (26). This tunneling generation inducing layer (24) is also a layer for band-to-band tunneling of electrons around the PN junction, and for this reason, it is a necessary doped layer to embody the present invention. To start the band-to-band tunneling, the preferable peak doping concentration of the N-type impurities is over $1 \times 10^{18}/cm^3$.

To embody the three doped layers (20), P-type impurities of a threshold voltage control layer (22) are boron (B) or indium (In), and N-type impurities of a avalanche generation inducing layer (26) are phosphorus (P) or arsenic (As), and N-type impurities of a tunneling generation inducing layer (24) are arsenic (As) or antimony (Sb) when N-type impurities of the avalanche generation inducing layer are phosphorus (P). Otherwise N-type impurities of a tunneling generation inducing layer (24) are antimony (Sb) when N-type impurities of the avalanche generation inducing layer are arsenic (As).

Figure 9:
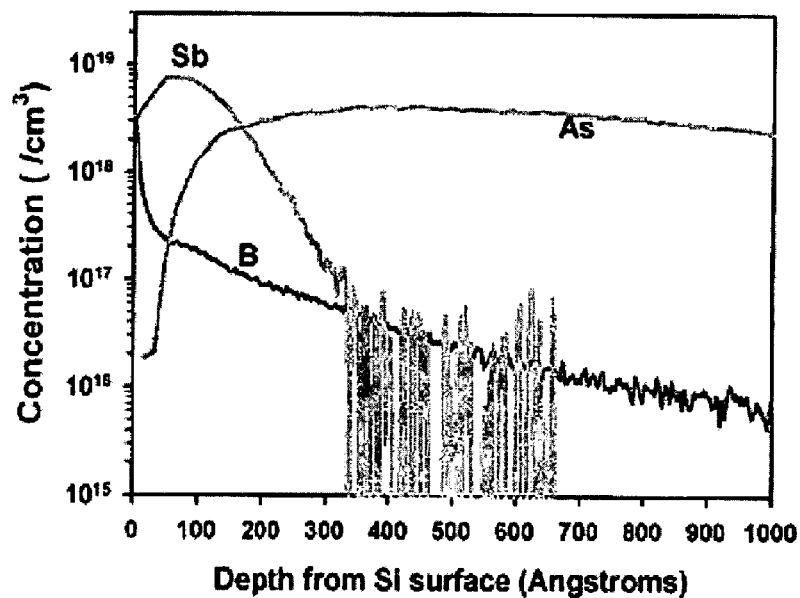
FIG. 9 illustrates result of a SIMS analysis with three doped layers according to embodiments of the present invention.

FIG. 9 shows the result of SIMS analysis of the embodiment of three doped layers (20) with boron (B) as P-type impurities of a threshold voltage control layer (22), arsenic (As) as N-type impurities of an avalanche generation inducing layer (26) and antimony (Sb) as N-type impurities of a tunneling generation inducing layer (24).

The gate can be a metal such as TaN, but a polysilicon doped with impurities is preferable in order to follow a conventional CMOS process. Especially, P-type impurities are preferable for a polysilicon gate, because creating source/drain regions (30) and doping a gate with impurities at the same time makes less expenditure for fabricating a memory cell.

Second Embodiment of the Memory Cell Structure

As shown in FIG. 10, the second embodiment of the charge trap memory cell structure of the present invention is as follows. In a conventional charge trap memory cell structure, an N-type well (12) is formed on the semiconductor substrate (10), and the active region is formed by three doped layers (20) inside the N-type well, and source/drain region (30) is a PMOS structure doped with P-type impurities.

Three doped layers (20) is the same as the first embodiment in that it is composed of a threshold voltage control layer (22), a tunneling generation inducing layer (24) and an avalanche generation inducing layer (26) from top of the substrate. Descriptions for each layer and the gate are the same as the first embodiment of the cell structure.

The semiconductor substrate (10) can be a P-type substrate, but it is not limited to P-type substrate.

Third Embodiment of the Memory Cell Structure

As shown in FIG. 11, the third embodiment of the charge trap memory cell structure of the present invention is as follows. In a conventional charge trap memory cell structure, N-type well (12) is formed on the semiconductor substrate (10), and the active region is formed by two doped layers (20') inside the N-type well, and source/drain region (30) is a PMOS structure doped with P-type impurities.

The characteristic of this embodiment is that the active region is formed with multi-doped layers such as two doped layers (20') inside the N-type well (12).

Two doped layers (20') are composed of a threshold voltage control layer (22) and a tunneling generation inducing layer (24) from top of the substrate, and descriptions for each layer and the gate are the same as the first embodiment of the cell structure.

In the same manner as the first and second embodiment of the cell structure, as shown in FIG. 6, when specific reverse bias is applied to the N-type well (12), deep depletion is induced, and finally, the N-type well functions as an avalanche generation inducing layer in the embodiments.

Therefore, it is preferable for the peak doping concentration for N-type well impurities to be over $5 \times 10^{17}/cm^3$ in order for functioning as an avalanche generation inducing layer.

The semiconductor substrate (10) can be a P-type substrate, but it is not limited to P-type substrate.

Next, detailed explanations of the method for fabricating the charge trap memory cell of the present invention are as follows.

First Embodiment of the Method for Fabricating a Memory Cell

In a different way from the conventional method for fabricating a charge trap memory cell, the present invention can be characterized by forming an active region, which includes forming an N-type well in the substrate before creating multi-doped layers, and forming three doped layers inside the N-type well.

Forming the N-type well starts from injecting $P^+$ or $As^+$ ions into the substrate and forming three doped layers comprises forming an avalanche generation inducing layer by injecting $P^+$ or $As^+$ ions into the substrate again, forming a tunneling generation inducing layer above the avalanche generation inducing layer by injecting $As^+$ or $Sb^+$ ions when $P^+$ ions are injected into the substrate to form an avalanche generation inducing layer, or else by injecting $Sb^+$ ions when $As^+$ ions are injected into the substrate, and forming a threshold voltage control layer by injecting $BF^{2+}$ or $In^+$ ions on the surface of the substrate above the tunneling generation inducing layer.

In the step of forming an avalanche generation inducing layer, it is preferable to embody two steps of first injecting $P^+$ or $As^+$ ions, wherein the dose of ions ranges from $5\times10^{12}/cm^2$ to $5\times10^{13}/cm^2$ at an energy between 40 and 80 keV and second injecting the same ion with the same dose at an energy between 100 and 150 keV to form a doped layer widely and deeply below the source/drain region. Also, it is possible to embody the step of forming an avalanche generation inducing layer by dividing into more than three steps with different ion injection energy.

In the step of forming a tunneling generation inducing layer, it is preferable that forming a tunneling generation inducing layer on the avalanche generation inducing layer is accomplished by injecting $As^+$ or $Sb^+$ ions into the substrate in a range of $5\times10^{12}/cm^2$ to $5\times10^{13}/cm^2$ at an energy between 15 and 40 keV when an avalanche generation inducing layer is formed by injecting $P^+$ ions into the substrate, otherwise injecting $Sb^+$ ions into the substrate in a range of $5\times10^{12}/cm^2$ to $5\times10^{13}/cm^2$ at an energy between 15 and 40 keV when an avalanche generation inducing layer is formed by injecting $As^+$ ions.

In the step of forming a threshold voltage control layer, it is preferable to inject $BF^{2+}$ or $In +$ ions in a range of $5\times10^{12}/cm^2$ to $7\times10^{13}/cm^2$ at an energy between 1 and 15 keV into the substrate.

Second Embodiment of the Method for Fabricating a Memory Cell

The second embodiment of the method for fabricating a memory cell of the present invention can be characterized by forming the active region, which includes forming an N-type well in the substrate before creating multi-doped layers, and forming two doped layers inside the N-type well.

Forming an N-type well starts from injecting $P^+$ or $As^+$ ions into the substrate and forming two doped layers comprises forming a tunneling generation inducing layer inside the N-type well by injecting $As^+$ or $Sb^+$ ions when $P^+$ ions are injected into the substrate to form an N-type well, or else by injecting $Sb^+$ ions when $As^+$ ions are injected into the substrate, and forming a threshold voltage control layer by injecting $BF^{2+}$ or $In +$ ions on the surface of the substrate above the tunneling generation inducing layer.

In the step of forming an N-type well, it is preferable to embody two steps of first injecting $P^+$ or $As^+$ ions, wherein the dose of ions ranges from $5\times10^{12}/cm^2$ to $5\times10^{13}/cm^2$ at an energy between 40 and 80 keV and second injecting the same ion with the same dose at an energy between 100 and 150 keV to form an N-type well widely and deeply below the source/drain region. Also, it is possible to embody the step of forming an N-type well by dividing into more than three steps with different ion injection energy.

In the step of forming a tunneling generation inducing layer, it is preferable that forming a tunneling generation inducing layer inside an N-type well is accomplished by injecting $As^+$ or $Sb^+$ ions into the substrate in a range of $5\times10^{12}/cm^2$ to $5\times10^3/cm^2$ at an energy between 15 and 40 keV when an N-type well is formed by injecting $P^+$ ions into the substrate, otherwise injecting $Sb^+$ ions into the substrate in a range of $5\times10^{12}/cm^2$ to $5\times10^{13}/cm^2$ at an energy between 15 and 40 keV when an N-type well is formed by injecting $As^+$ ions.

In the step of forming a threshold voltage control layer, it is preferable to inject $BF^{2+}$ or $In^+$ ions in a range of $5\times10^{12}/cm^2$ to $7\times10^{13}/cm^2$ at an energy between 1 and 15 keV into the substrate.

Next, detailed explanations of the method for operating the charge trap memory cell of the present invention are as follows.

First Embodiment of the Method for Programming a Memory Cell

According to the present invention, the programming operation is carried out by applying a predetermined bias voltage to the contact terminal of the charge trap memory cell, for accelerating electrons band-to-band tunneled from the tunneling generation inducing layer at the deep depletion region of the N-well or the avalanche generation inducing layer to generate an avalanche phenomenon, accelerating holes, which were generated from the avalanche phenomenon, from the deep depletion region of the N-well or the avalanche generation inducing layer toward the surface of substrate again to generate hot holes, and injecting hot holes into the multi-dielectric layers with the help of the gate field, and therefore it can be carried out by applying specific voltage $V_S$ to both contact terminals of the source region and the drain region, applying lower voltage $V_G$ than the voltage $V_S$ to the contact terminal of the gate, and applying higher voltage $V_B$ than the voltage $V_S$ to the contact terminal of the active region.

More specifically, in the programming, the voltage $V_S$ is 0V (ground), the voltage $V_G$ is between −5 and −118V, and the voltage $V_B$ is between 2 and 10V.

Figure 12:
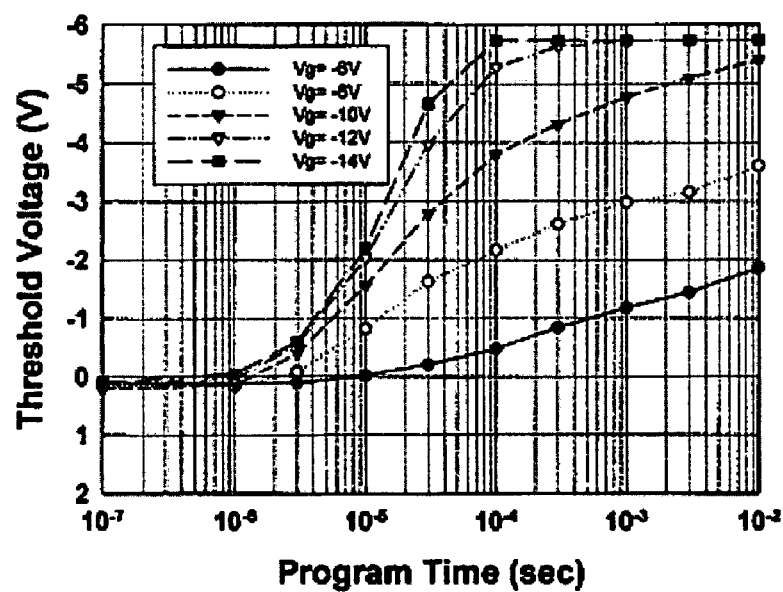
FIG. 12 is a graph illustrating the electrical characteristics as the result of one embodiment of programming for the memory cell of the present invention.
Figure 13:
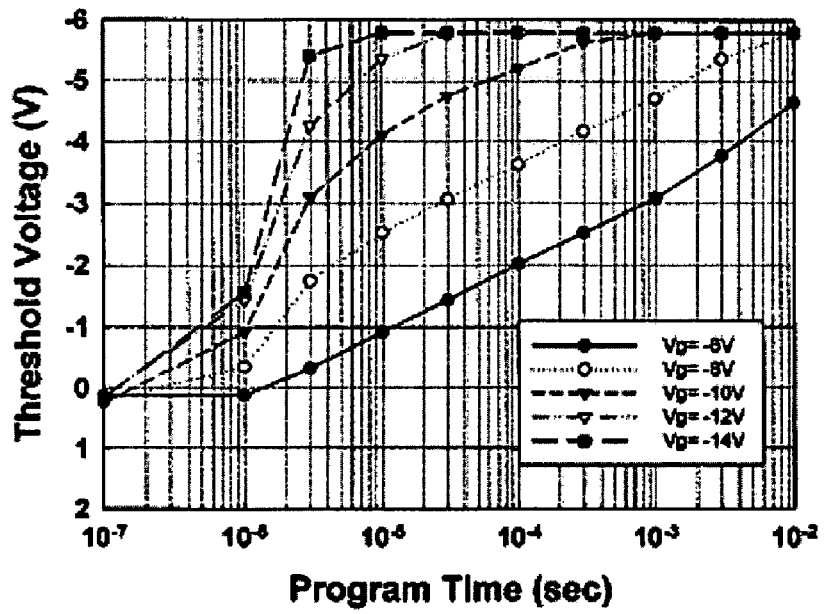
FIG. 13 is a graph illustrating the electrical characteristics as the result of another embodiment of programming for the memory cell of the present invention.

Among the embodiments, the result of programming that the voltage $V_S$ is 0V (ground), the voltage $V_G$ is between −6 and −14V, and the voltage $V_B$ is 4V is as shown in FIG. 12, and the result of programming that the voltage $V_S$ is 0V (ground), the voltage $V_G$ is between −6 and −14V, and the voltage $V_B$ is 5V is as shown in FIG. 13.

From FIG. 13, it can be seen that the threshold shift of more than 5V could be attained within only 3 μsec. Also, it can be seen that the threshold voltage does not increase higher than specific voltage (−5.8V as in FIG. 13.). From these results, it can be inferred that even charge trapped in the nitride layer (44) made the electric field around the oxide layer (Tunnel Oxide; 46) weak, hot holes accelerated from the avalanche generation inducing layer (26) have large kinetic energy, so it can be easily and continuously trapped into the nitride layer (44) by the saturation point (it depends on the nitride trap density).

The embodiments are accomplished by applying reverse bias to the contact terminals of the source region and the drain region and the contact terminal of the active body for inducing electrons to band-to-band tunnel at the PN junction of the tunneling generation inducing layer and the source/drain region; and applying reverse bias voltage to the contact terminal of the active body region and gate voltage for accelerating the electrons to generate an avalanche phenomenon, and accelerating the holes generated from the avalanche phenomenon to inject as hot hole state into the multi-dielectric layers, and therefore it is not limited to the figures of the embodiments.

The first embodiment of the method of programming the cell can be utilized especially as a programming method at the NAND type flash memory array using the charge trap memory cell which is one of examples of the present invention.

Second Embodiment of the Method for Programming a Memory Cell

According to an embodiment of the present invention, the programming operation is carried out by applying a predetermined bias voltage to the contact terminal of the charge trap memory cell for accelerating electrons band-to-band tunneled from the tunneling generation inducing layer at the deep depletion region of the N-well or the avalanche generation inducing layer to generate an avalanche phenomenon, accelerating holes, which were generated from the avalanche phenomenon, from the deep depletion region of the N-well or the avalanche generation inducing layer toward the surface of substrate again to generate hot holes, and injecting hot holes into the multi-dielectric layers with the help of the gate field, and therefore it can be performed by applying specific voltage $V_S$ to one of the contact terminals of the source region and the drain region and floating the other region, applying lower voltage $V_G$ than the voltage $V_S$ to the contact terminal of the gate, and applying higher voltage $V_B$ than the voltage $V_S$ to the contact terminal of the active region.

Specifically, in the programming, the voltage $V_S$ is 0V (ground), the voltage $V_G$ is between −5 and −18V, and the voltage $V_B$ is between 2 and 10V.

The embodiments are accomplished by applying reverse bias to the contact terminal of the source region or the drain region and the contact terminal of the active body for inducing electrons to band-to-band tunnel at the PN junction of the tunneling generation inducing layer and the source/drain region; and applying reverse bias voltage to the contact terminal of the active body region and gate voltage for accelerating the electrons to generate an avalanche phenomenon, and accelerating the holes generated from the avalanche phenomenon to inject as hot hole state into the multi-dielectric layers, and therefore it is not limited to the figures of the embodiments.

The second embodiment of the method of programming the cell can be utilized especially as a programming method at the NOR type flash memory array using the charge trap memory cell which is one of examples of the present invention.

First Embodiment of the Method for Erasing a Memory Cell

According to the present invention, the erasing operation is carried out by applying a predetermined bias voltage to the contact terminal on the charge trap memory cell, and injecting electrons by Fowler-Nordheim tunneling from the channel of the active region into the multi-dielectric layers, and therefore it can be performed by applying specific voltage $V_B$ to the contact terminal of the active body region, applying higher voltage $V_G$ than the voltage $V_B$ to the contact terminal of the gate, and floating the contact terminals of both the source region and the drain region.

More specifically, in the erasing operation, the voltage $V_B$ is between −10 to −20V, and the voltage $V_G$ is 0V (ground).

The embodiments can be fulfilled by injecting electrons by F-N tunneling from the channel of the active region into the multi-dielectric layers, and for this reason, the present invention is not limited to the figures of the embodiments.

The first embodiment of the method of erasing the cell can be utilized especially as an erasing method at the NAND type flash memory array using the charge trap memory cell which is one of examples of the present invention.

Second Embodiment of the Method for Erasing a Memory Cell

According to the present invention, the erasing operation is carried out by applying a predetermined bias voltage to the contact terminal on the charge trap memory cell, and injecting electrons by Fowler-Nordheim tunneling from the channel of the active region into the multi-dielectric layers, and therefore it can be performed by applying specific voltage $V_B$ to the contact terminal of the active region, applying higher voltage $V_G$ than the voltage $V_B$ to the contact terminal of the gate, floating one of the contact terminals of the source region and the drain region, and applying the same voltage $V_S$ as the voltage $V_B$ to the other region.

More specifically, in the erasing, the voltage $V_B$ is between −10 to −20V, and the voltage $V_G$ is 0V (ground).

Also, the embodiments can be fulfilled by injecting electrons by F-N tunneling from the channel of the active region into the multi-dielectric layers, and for this reason, the present invention is not limited to the figures of the embodiments.

The second embodiment of the method of erasing the cell can be utilized especially as an erasing method at the NOR type flash memory array using the charge trap memory cell which is one of examples of the present invention.

Third Embodiment of the Method for Erasing a Memory Cell

According to the present invention, the erasing operation is carried out by applying a predetermined bias voltage to the contact terminal on the charge trap memory cell, and injecting electrons by Fowler-Nordheim tunneling from the channel of the active region into the multi-dielectric layers, and therefore it can be performed by applying specific voltage $V_B$ to the contact terminal of the active region, applying higher voltage $V_G$ than the voltage $V_B$ to the contact terminal of the gate, and applying the same voltage $V_S$ as the voltage $V_B$ to the contact terminals of both the source region and the drain region.

More specifically, in the erasing, the voltage $V_B$ is between −10 to −20V, and the voltage $V_G$ is 0V (ground).

Figure 14:
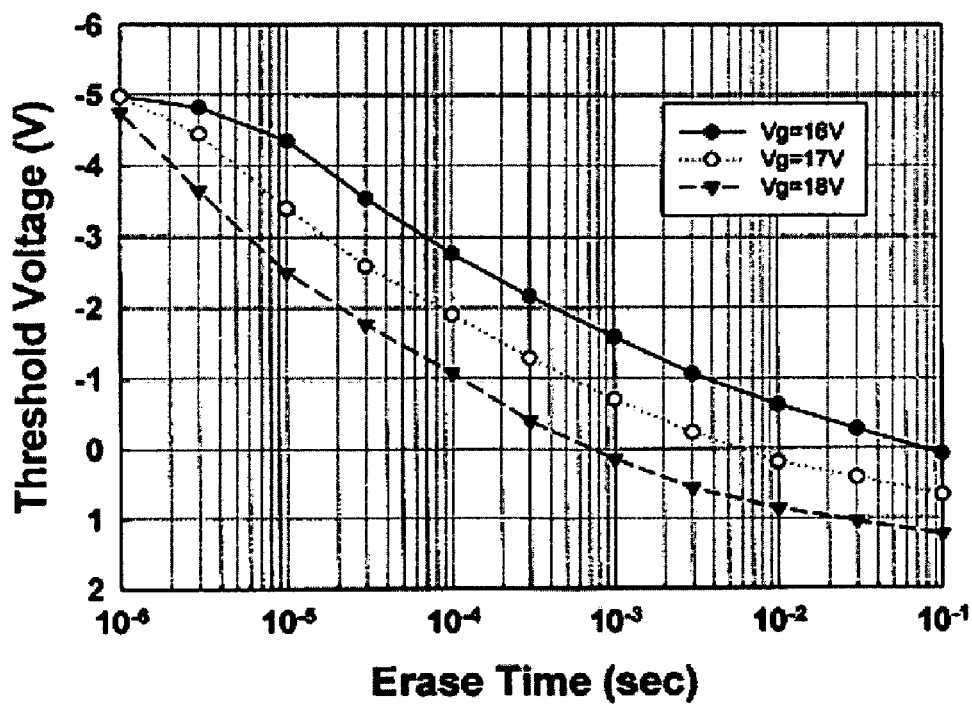
FIG. 14 is a graph illustrating the electrical characteristics as the result of one embodiment of erasing the memory cell of the present invention.

And in the erasing, the voltage $V_B$ may be 0V (ground), and the voltage $V_G$ may be between 10 to 20V. In this case, the erase characteristics of splits are as shown in FIG. 14. The threshold voltage shift of about 4V was accomplished within 100 μsec at gate voltage of 18 V. From this result, it can be verified that the present invention accomplished more improved erasing speed than the conventional arts did.

And, the embodiments can be fulfilled by injecting electrons by F-N tunneling from the channel of the active region into the multi-dielectric layers, and for this reason, the present invention is not limited to the figures of the embodiments.

The third embodiment of the method of erasing the cell can be utilized especially as an erasing method at the NAND type flash memory array using the charge trap memory cell which is one of examples of the present invention.

The endurance characteristics of the charge trap memory cell of the present invention were tested and the condition of the test was as follows.

Figure 15:
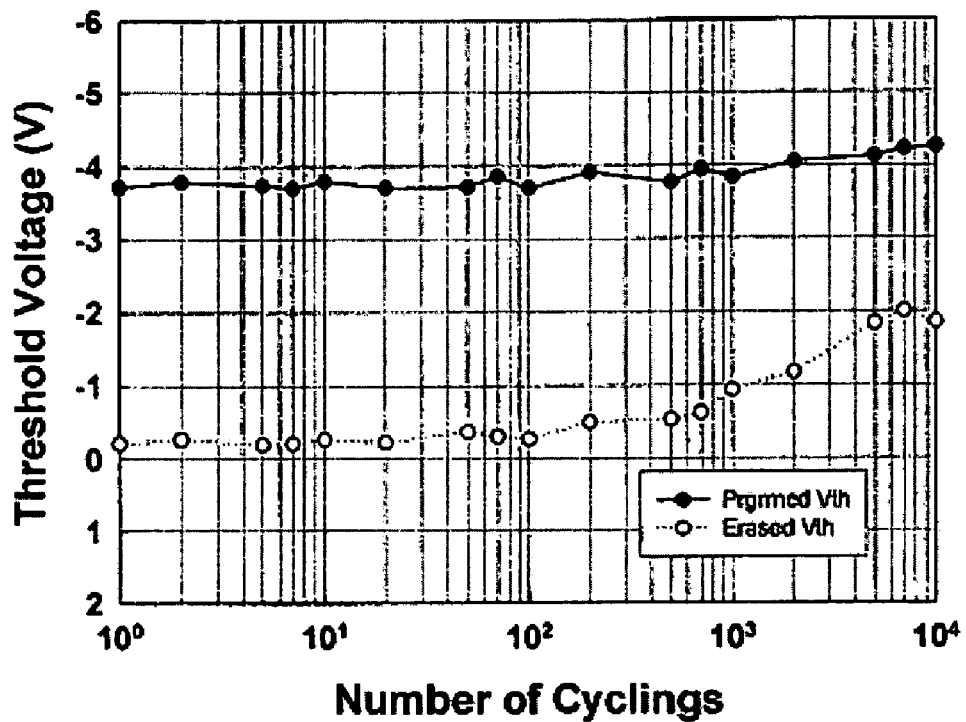
FIG. 15 is a graph illustrating the endurance characteristics of an embodiment of the memory cell of the present invention.

The charge trap memory cell was embodied by forming an avalanche generation inducing layer, a tunneling generation inducing layer and a threshold voltage control layer sequentially. The avalanche generation inducing layer (26) was formed by injecting As$^+$ ions of $1.6 \times 10^{13}/cm^2$ with 60 keV and injecting the same dose with 120 keV and injecting the same dose with 180 keV. On the avalanche generation inducing layer (26), the tunneling generation inducing layer (24) was formed by injecting Sb$^+$ ions of $1.5 \times 10^{13}/cm^2$ with 20 keV. Above the tunneling generation inducing layer (24), the threshold voltage control layer (22) was formed by injecting BF$^{2+}$ ions of $2.5 \times 10^{13}/cm^2$ with 5 keV. With the charge trap memory cell, the program condition was $V_G = -10\,V$, $V_B = 4\,V$, $V_S = V_D = 0V$ ($T_{PGM} = 100$ μsec), and the erase condition was $V_G = 18V$, $V_B = V_S = V_D = 0V$ ($T_{ERS} = 1$ msec). As shown in FIG. 15, the endurance characteristic was excellent that changes in the threshold voltage was no more than 2 V after 10,000 program/erase cycling.

Figure 16:
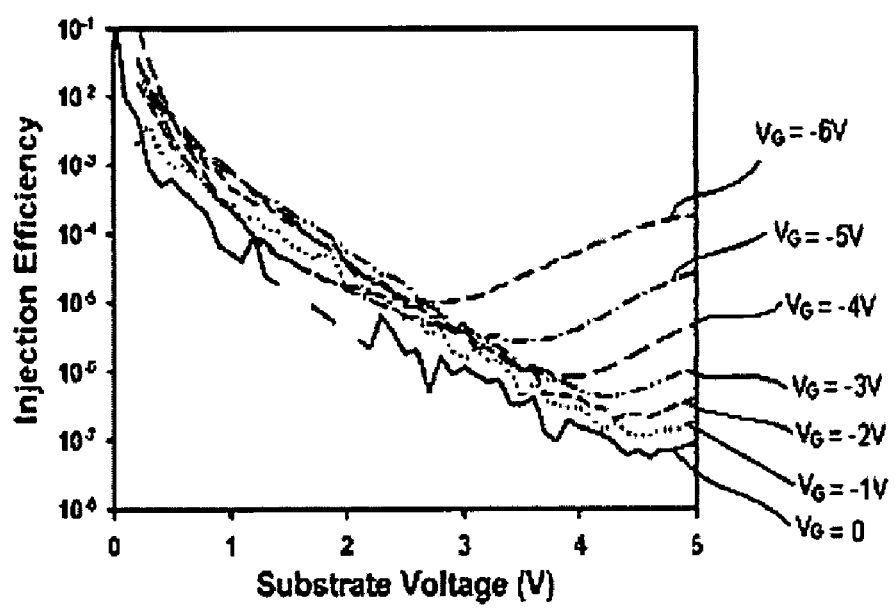
FIG. 16 is a graph illustrating the injection efficiency of the memory cell of an embodiment of the present invention.

To investigate power consumption characteristics of the charge trap memory cell application of the present invention, experiments were performed with the same memory cell as the endurance test. FIG. 16 shows the result of carrier injection efficiency according to the $V_B$ application, of which $V_G$ is varied from 0 to −6V at $V_S = V_D = 0V$.

The carrier injection efficiency (γ) is defined as the ratio of the current of the gate ($I_G$) by hot holes injected into the nitride layer to the current of the active body region ($I_B$), and it indicates the program efficiency and power consumption characteristics of memory cell.

$$\gamma = |I_G|/|I_B| = |I_G|/|I_S + I_D|$$

From FIG. 16, it is inferred that the bigger the absolute value of the gate voltage, the higher the injection efficiency, and injection efficiency lies between $10^{-4}$ and $10^{-3}$ at $V_G$ is −6V, which value is much larger than that ever reported CHE ($10^{-6}$).

Next, detailed explanations of the NAND type flash memory array structure using the charge trap memory cell of the present invention are as follows.

[Embodiment of the NAND Type Flash Memory Array Structure]

Figure 17:
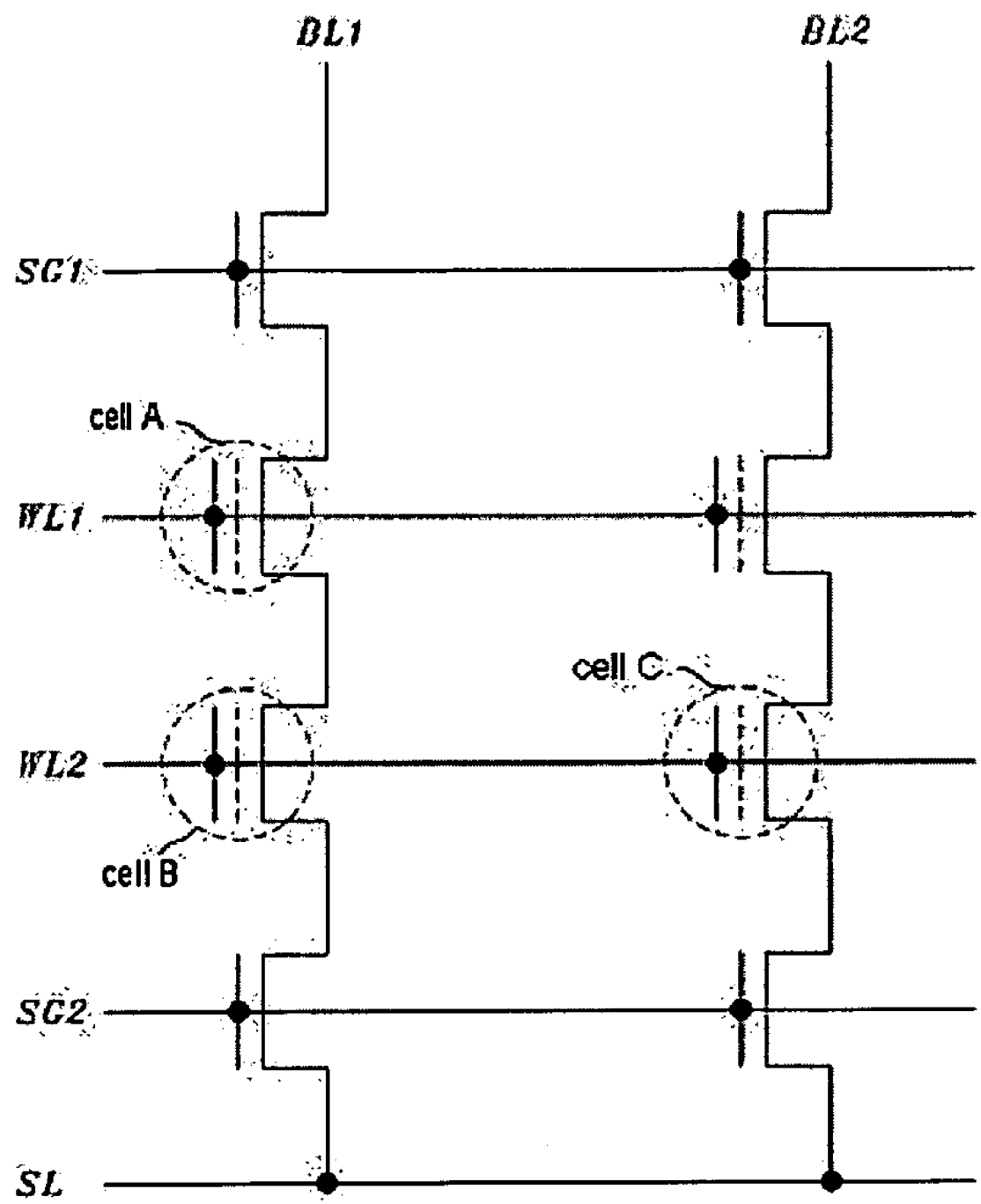
FIG. 17 is a schematic diagram of the NAND flash memory array of an embodiment of the present invention.

FIG. 17 shows the NAND type flash memory array according to an embodiment of the present invention. But FIG. 17 is only the simple description of a NAND type flash memory array, and actually 16 or 32 word lines can be arranged between the first selective gate line (SG1) and the second selective gate line (SG2) of each bit line.

That is, in the flash memory array, which includes one or more bit lines, and on the each bit line, the first selective transistor, a plurality of charge trap memory cells and the second selective transistor are connected in series in a manner that each drain is connected to the corresponding source; a source of the second selective transistor is connected electrically to common source line, which is arranged vertically to the bit line; a gate of the first selective transistor and a gate of the second selective transistor are connected electrically to the first selective gate line and the second selective gate line respectively, which cross the bit lines; and the plurality of charge trap memory cell gates are connected electrically to a plurality of word lines respectively, which cross the bit lines, wherein the charge trap memory cell comprises a semiconductor substrate; an active region which is formed with multi-doped layers in the substrate; a gate formed over the active region; source and drain regions formed in the active region, wherein the source and drain regions are adjacent to the gate, and a gap is located between the source and drain regions; and multi-dielectric layers including a charge trap layer, wherein multi-dielectric layers are located between the gate and the active region, so the flash memory array is characterized with using the charge trap memory cell of the present invention.

Therefore, the first, second and third embodiments of the charge trap memory cell is applicable to the NAND type flash memory array structure similarly, descriptions about the embodiments are omitted.

Next, detailed explanations of the method for operating the NAND type flash memory array using the charge trap memory cell of the present invention are as follows.

Embodiment of the Method for Programming the NAND Type Flash Memory Array

According to an embodiment of the present invention, the programming operation is carried out by applying a predetermined bias voltage to each contact terminal of the NAND type flash memory array, as shown in FIG. 17, for accelerating electrons band-to-band tunneled from the tunneling generation inducing layer of the selected specific charge trap memory cell (cell B) at the deep depletion region of the N-well or the avalanche generation inducing layer to generate an avalanche phenomenon, accelerating holes, which were generated from the avalanche phenomenon, from the deep depletion region of the N-well or the avalanche generation inducing layer toward the surface of substrate again to generate hot holes, and injecting hot holes into the multi-dielectric layers of the selected specific charge trap memory cell (cell B) with the help of the gate field, and therefore it can be carried out by applying specific voltage $V_B$ to the contact terminal of the active region of block including the selected specific charge trap memory cell (cell B), applying lower voltage $V_{SEL}$ than the voltage $V_B$ to the bit line (BL1), where the source/drain of the selected specific charge trap memory cell (cell B) is connected electrically to other cell (cell A) in series in order to generate the band-to-band tunneling and the avalanche phenomenon, applying the same or lower voltage $V_{UNS}$ than the voltage $V_B$, but higher than the voltage $V_{SEL}$ to other bit lines (BL2) not to generate the band-to-band tunneling and the avalanche phenomenon, applying lower voltage $V_{PGM}$ than the voltage $V_{SEL}$ to the word lines (WL2), to which the gate of the selected specific charge trap memory cell (cell B) is connected electrically, in order to inject hot holes formed from the active region into the multi-dielectric layers, applying $V_{PASS}$, which is lower than the voltage $V_{SEL}$ and higher than the voltage $V_{PGM}$, to the word lines (WL1) in order to turn on the channel of the cell (cell A) which is connected to the word lines and not to generate the injection of hot holes, applying lower voltage $V_{SG1}$ than $V_{SEL}$ to the first selective gate line (SG1) to turn on the first selective transistor, applying $V_{SG2}$, which is higher than the voltage $V_{SEL}$ to the second selective gate lines (SG2) in order to turn off the second selective transistor, and applying $V_S$, which is lower than the voltage $V_B$ and higher than the voltage $V_{SEL}$, to the common source lines (SL). As a matter of course, the embodiment is described on the assumption that the first and the second selective transistors are PMOSFET. More specifically, in the programming operation, the voltage $V_B$ is between 2 and 10 V, the voltage $V_{SEL}$ is 0 V (ground), the voltage $V_{UNS}$ is the same as $V_B$, the voltage $V_{PASS}$ is between −2 and −10V, the voltage $V_{PGM}$ is between −11 and −18V, the voltage $V_{SG1}$ is between −5 and −10V, the voltage $V_{SG2}$ is between 1 and $S_V$, and the voltage $V_S$ is 0V (ground).

Embodiment of the Method for Erasing the NAND Type Flash Memory Array

According to an embodiment of the present invention, the erasing operation is carried out by applying a predetermined bias voltage to the contact terminal on the NAND type flash memory array, as shown in FIG. 17, and injecting electrons by Fowler-Nordheim tunneling from the channel of each active region into the multi-dielectric layers in order to erase all of the charge trap memory cells in the specific block simultaneously, and therefore it can be performed by applying specific voltage $V_B$ to the contact terminal of the active region of block including the specific charge trap memory cell (cell B), applying higher voltage $V_{ERS}$ than the voltage $V_B$ to all word lines (WL1, WL2) of the block in order to generate the Fowler-Nordheim tunneling on the charge trap memory cells which are connected electrically to word lines.

More specifically, the erasing operation of charge trap memory cells of specific block is carried out simultaneously by floating each the bit lines (BL1, BL2), applying the same voltage of $V_{SG1}$ and $V_{SG2}$ as $V_B$, floating the common source line (SL), and applying 16 to 21V higher $V_{ERS}$ than $V_B$.

Next, detailed explanations of the NOR type flash memory array structure using the charge trap memory cell of the present invention are as follows.

Embodiment of the NOR Type Flash Memory Array Structure

Figure 18:
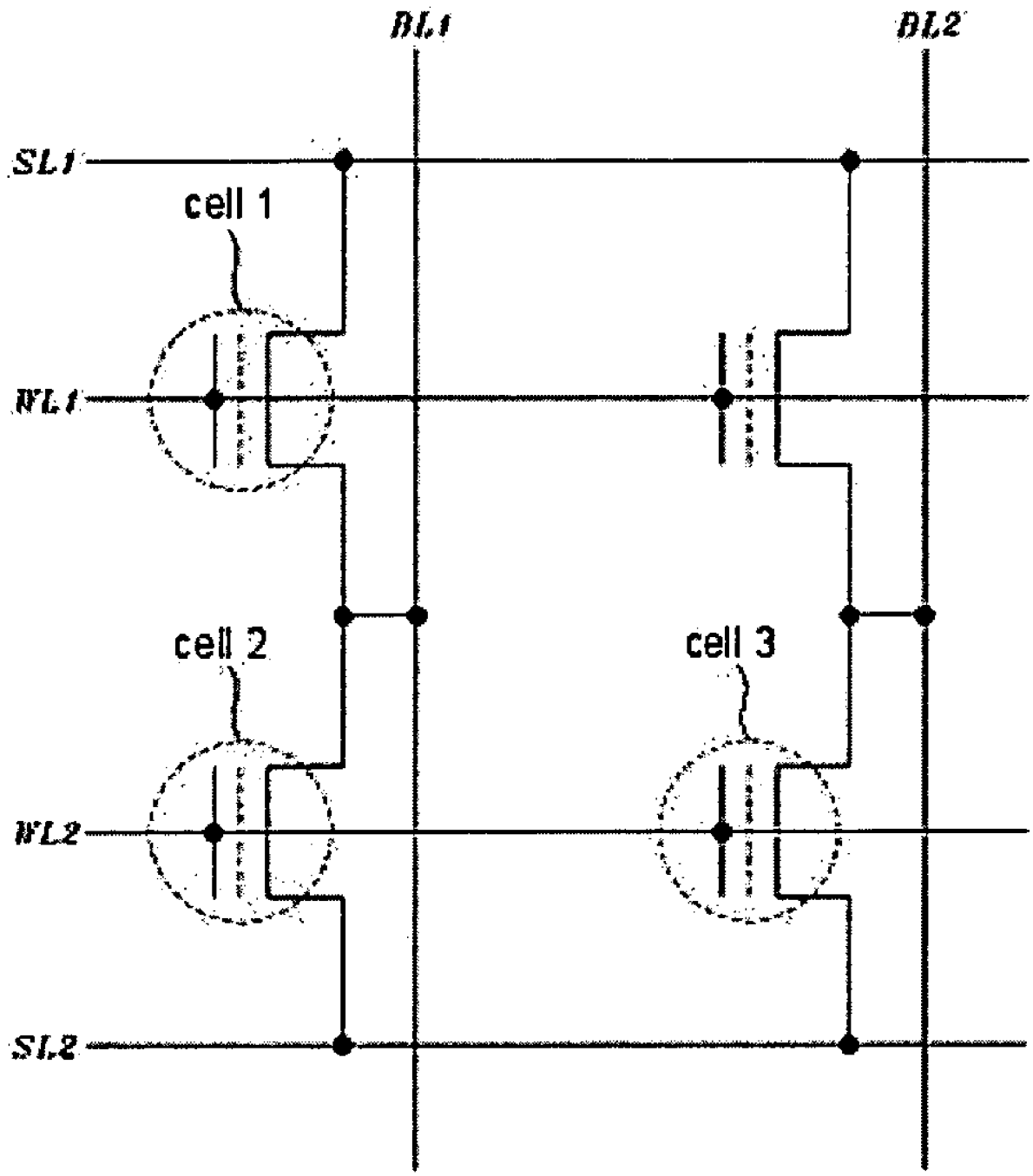
FIG. 18 is a schematic diagram of the NOR flash memory array of an embodiment of the present invention.

FIG. 18 shows the NOR type flash memory array according to the present invention. But FIG. 18 is only the simple description of NOR type flash memory array, and actually 16 or 32 word lines can be arranged across each bit line.

That is, in the flash memory array which includes one or more bit lines, drains of a plurality of charge trap memory cells are connected electrically to each bit line; gates of a plurality of charge trap memory cells are connected electrically to a plurality of word lines, respectively, which cross the bit lines; and sources of a plurality of charge trap memory cells are connected electrically to a plurality of source lines, respectively, which cross the bit lines, wherein the charge trap memory cell comprises a semiconductor substrate; an active region, which is formed with multi-doped layers in the substrate; a gate formed over the active region; source and drain regions formed in the active region, wherein the source and drain regions are adjacent to the gate, and a gap is located between the source and drain regions; and multi-dielectric layers including a charge trap layer, wherein multi-dielectric layers are located between the gate and the active region, so the flash memory array is characterized with using the charge trap memory cell of the present invention.

Therefore, the first, second and third embodiments of the charge trap memory cell is applicable to the NOR type flash memory array structure similarly. Thus, descriptions about the embodiments are omitted.

Next, detailed explanations of the method for operating the NOR type flash memory array using the charge trap memory cell of the present invention are as follows.

Embodiment of the Method for Programming the NOR Type Flash Memory Array

According to embodiments of the present invention, the programming operation is carried out by applying a predetermined bias voltage to the each contact terminal of the NOR type flash memory array, as shown in FIG. 18, for accelerating electrons band-to-band tunneled from the tunneling generation inducing layer of the selected specific charge trap memory cell (cell 2) at the deep depletion region of the N-well or the avalanche generation inducing layer to generate an avalanche phenomenon, accelerating holes, which were generated from the avalanche phenomenon, from the deep depletion region of the N-well or the avalanche generation inducing layer toward the surface of substrate again to generate hot holes, and injecting hot holes into the multi-dielectric layers of the selected specific charge trap memory cell (cell 2) with the help of the gate field, and therefore it can be carried out by applying a specific voltage $V_B$ to the contact terminal of the active region of the block including the selected specific charge trap memory cell (cell 2), applying lower voltage $V_{SEL}$ than the voltage $V_B$ to the bit line (BL1), where the drain of the selected specific charge trap memory cell (cell 2) is connected electrically in order to generate the band-to-band tunneling and the avalanche phenomenon, applying the same or lower voltage $V_{UNS}$ than the voltage $V_B$, but higher than the voltage $V_{SEL}$ to other bit lines (BL2) not to generate the band-to-band tunneling and the avalanche phenomenon, applying lower voltage $V_{PGM}$ than the voltage $V_{SEL}$ to the word lines (WL2), to which the gate of the selected specific charge trap memory cell (cell 2) is connected electrically, in order to inject hot holes formed from the active region into the multi-dielectric layers, applying $V_{PASS}$, which is lower than the voltage $V_{SEL}$ and higher than the voltage $V_{PGM}$, to the word lines (WL1) in order to turn on the channel of the cell (cell 1) which is connected to the word lines and not to generate the injection of hot holes, and floating the source line which the source of the selected specific charge trap memory cell (cell 2) is connected electrically to.

More specifically, in the programming operation for the selected specific charge trap memory cell (cell 2), the voltage $V_B$ is between 2 and 10V, the voltage $V_{SEL}$ is 0V (ground), the voltage $V_{UNS}$ is the same as $V_B$, the voltage $V_{PASS}$ is between −2 and −10V, the voltage $V_{PGM}$ is between −11 and −18V.

Embodiment of the Method for Erasing the NOR Type Flash Memory Array

According to embodiments of the present invention, the erasing operation is carried out by applying a predetermined bias voltage to the contact terminal on the NOR type flash memory array, as shown in FIG. 18, and injecting electrons by Fowler-Nordheim tunneling from the channel of the each active region into the multi-dielectric layers in order to erase all of the charge trap memory cells in the specific block simultaneously, and therefore it can be performed by applying specific voltage $V_B$ to the contact terminal of the active region of the block including the specific charge trap memory cell (cell 2), and applying higher voltage $V_{ERS}$ than the $V_B$ to all word lines (WL1, WL2) of the block in order to generate the Fowler-Nordheim tunneling on the charge trap memory cells, which are connected electrically to word lines.

More specifically, the erasing operation of charge trap memory cells of specific block is carried out simultaneously by applying the same voltage as the voltage $V_B$ or floating the each bit lines and source lines, and applying 16 to 21V higher $V_{ERS}$ than the voltage $V_B$.

The charge trap memory cell of the present invention utilizes the PMOSFET structure, which has been avoided due to the problems such as difficulties in downscaling owing to the diffusion of boron (B), which is usually used for P+ source/drain formation, and generation of large leakage current at junctions of the source/drain and the body when the body doping is increased. In the present invention, the problem of diffusion of boron is solved by forming an N-type tunneling generation inducing layer with high concentration on the substrate, and large leakage current resulted from the tunneling generation inducing layer with high concentration is rather utilized as a source to generate an avalanche phenomenon.

In addition, an N-type tunneling generation inducing layer with high concentration of the present invention is formed under the channel, and it prevents dopant diffusion of the source/drain, electrical punch-through of the channel and a short channel effect. For this reason, although it is the PMOSFET structure, it makes cell downsize as need be (It was validated that the cell worked well when the length of a gate was 50 nm in the embodiment of the present invention).

The programming which uses the hot hole injection scheme increases the injection efficiency, and it decreases the power consumption of cell operation. F-N tunneling is used for injecting electrons from the channel into the nitride layer in the erasing of the cell, and it made the usual erase speed problem settle thoroughly.

In comparison, both the programming (injection of the electrons) and the erasing (injection of holes) of the conventional charge trap memory cell use F-N tunneling, in the present invention the programming of the cell uses hot-hole injection method, and the erasing of the cell uses F-N tunneling method, and it leads remarkable speedup in both programming and erasing.

Therefore, the present invention brings the erase speed problem and the power consumption of cell operation to a settlement, makes cell downsize infinitely as need be, and it makes NAND type flash memory and NOR type flash memory high integrated, high capacious and high speedy.

And the present invention uses the conventional CMOS process as is, it will help materialize as well the System on Chip (SoC) which is formed by integrating various function blocks that comprise system such as logic on one chip as the memory array.

What is claimed is:

1. A charge trap memory cell comprising:
   a semiconductor substrate having active and field regions;
   a gate formed over the active region;
   source and drain regions formed in the active region, wherein the source and drain regions are doped with P-type impurities; and
   multi-dielectric layers including a charge trap layer, wherein multi-dielectric layers are located between the gate and the active region of substrate,
   wherein the active region is formed with multi-doped layers including a tunneling generation inducing layer doped with N-type impurities to form a PN junction with the source/drain regions and an avalanche generation inducing layer doped with N-type impurities under the tunneling generation inducing layer.

2. The charge trap memory cell of claim 1, wherein the tunneling generation inducing layer and the avalanche generation inducing layer are inside an N-type well formed in the semiconductor substrate.

3. The charge trap memory cell of claim 2, wherein the peak doping concentration of impurities of the N-type well and the avalanche generation inducing layer is over $5 \times 10^{17}$ / $cm^3$, and the peak doping concentration of N-type impurities of the tunneling generation inducing layer is over $1 \times 10^{18}$ / $cm^3$.

4. The charge trap memory cell of claim 2, wherein the avalanche generation inducing layer is formed widely and deeply below the source/drain regions.

5. The charge trap memory cell of claim 4, wherein the multi-doped layers comprises a threshold voltage control layer above the tunneling generation inducing layer inside the N-type well of the semiconductor substrate, and the threshold voltage layer is formed by doping with P-type impurities.

6. The charge trap memory cell of claim 4, wherein the N-type impurities of the avalanche generation inducing layer are phosphorus (P) or arsenic (As), and the N-type impurities of the tunneling generation inducing layer are arsenic (As) or antimony (Sb).

7. The charge trap memory cell of claim 4, wherein the peak doping concentration of N-type impurities of the avalanche generation inducing layer is over $5 \times 10^{17}$ /$cm^3$, and the peak doping concentration of N-type impurities of the tunneling generation inducing layer is over $1 \times 10^{18}$ /$cm^3$.

8. A NAND type flash memory array comprising:
   one or more bit lines;
   the first selective gate line arranged vertically to the bit lines;
   a plurality of word lines arranged vertically to the bit lines;
   the second selective gate line arranged vertically to the bit lines;
   a common source line arranged vertically to the bit lines; and
   a plurality of charge trap memory cells connected in series with the first selective transistor and the second selective transistor along by each bit line, each of the charge trap memory cells including,
   a semiconductor substrate having active and field regions;
   a gate formed over the active region;
   source and drain regions formed in the active region, wherein the source and drain regions are doped with P-type impurities; and
   multi-dielectric layers including a charge trap layer, wherein multi-dielectric layers are located between the gate and the active region of substrate,
   wherein the active region is formed with multi-doped layers including a tunneling generation inducing layer doped with N-type impurities to form a PN junction with the source/drain regions and an avalanche generation inducing layer doped with N-type impurities under the tunneling generation inducing layer.

9. The array of claim 8, wherein the tunneling generation inducing layer and the avalanche generation inducing layer of the charge trap memory cell are inside an N-type well formed in the semiconductor substrate.

10. The array of claim 9, wherein the peak doping concentration of impurities of the N-type well and the avalanche generation inducing layer of the charge trap memory cell is over $5 \times 10^{17}$ /$cm^3$, and the peak doping concentration of N-type impurities of the tunneling generation inducing layer of the charge trap memory cell is over $\times 10^{18}$ /$cm^3$.

11. The array of claim 9, wherein the avalanche generation inducing layer is formed widely and deeply below the source/drain regions.

12. The array of claim 11, wherein the multi-doped layers of the charge trap memory cell comprise a threshold voltage control layer above the tunneling generation inducing layer inside the N-type well of the semiconductor substrate, and the threshold voltage layer is formed by doping with P-type impurities.

13. The array of claim 11, wherein the N-type impurities of the avalanche generation inducing layer of the charge trap memory cell are phosphorus (P) or arsenic (As), and the N-type impurities of the tunneling generation inducing layer of the charge trap memory cell are arsenic (As) or antimony (Sb).

14. The array of claim 11, wherein the peak doping concentration of N-type impurities of the avalanche generation inducing layer of the charge trap memory cell is over $5 \times 10^{17}$ /cm$^3$, and the peak doping concentration of N-type impurities of the tunneling generation inducing layer of the charge trap memory cell is over $1 \times 10^{18}$ /cm$^3$.

* * * * *

UNITED STATES PATENT AND TRADEMARK OFFICE
CERTIFICATE OF CORRECTION

| | |
|---|---|
| PATENT NO. | : 7,615,821 B2 |
| APPLICATION NO. | : 11/346659 |
| DATED | : November 10, 2009 |
| INVENTOR(S) | : Jae Sung Sim et al. |

Page 1 of 1

It is certified that error appears in the above-identified patent and that said Letters Patent is hereby corrected as shown below:

Column 10, line 43, the word "-118V" should read -- -18V --;

Column 15, line 5, the word "$S_v$," should read -- 5V --;

Column 18, line 61, the word "$x10^{18}/cm^3$" should read -- $1x10^{18}/cm^3$ --;

Column 18, line 63, the words "layer is" should read -- layer of the charge trap memory cell is --.

Signed and Sealed this

Nineteenth Day of January, 2010

David J. Kappos
*Director of the United States Patent and Trademark Office*